United States Patent [19]  [11] Patent Number: 4,992,792
Mori et al.                                [45] Date of Patent: Feb. 12, 1991

[54] DIGITAL-ANALOG CONVERTER FOR CONVERTING DIGITAL AUDIO SIGNALS

[75] Inventors: Ryoichi Mori, 1-24-12, Hakusan, Bunkyo-ku, Tokyo 113; Kazuo Toraichi, 1-14-2, Irimagawa, Sayama-shi, Saitama 350-13; Takashi Tokuyama, Iwaki; Youichi Hashimoto, Wako; Koichi Endo, Iwaki, all of Japan

[73] Assignees: Ryoichi Mori, Tokyo; Kazuo Toraichi, Saitama; Alpine Electronics Inc., Tokyo, all of Japan

[21] Appl. No.: 354,998

[22] Filed: May 22, 1989

[30] Foreign Application Priority Data

May 24, 1988 [JP] Japan .................. 63-126773

[51] Int. Cl.⁵ .............................. H03M 1/82
[52] U.S. Cl. ..................... 341/147; 341/144; 341/152
[58] Field of Search ............ 341/141, 144, 145, 147, 341/154; 364/851

[56] References Cited
U.S. PATENT DOCUMENTS

| 4,238,831 | 12/1980 | Pulyer | 341/144 |
| 4,614,934 | 9/1986 | Kobayashi et al. | 341/144 |
| 4,746,903 | 5/1988 | Czarniak et al. | 341/144 |
| 4,862,170 | 8/1989 | Hashimoto et al. | 341/144 |

Primary Examiner—William M. Shoop, Jr.
Assistant Examiner—Brian K. Young
Attorney, Agent, or Firm—Staas & Halsey

[57] ABSTRACT

A data generator generates digital data at a sampling time interval $\Delta T$ (sampling frequency $f_s = 1/\Delta T$), and the three latest items of digital data $V_{-1}$, $V_0$, $V_{+1}$ are repeatedly latched successively in three latch circuits every $3 \cdot \Delta T$. A pulse response signal generator outputs unit pulse response signals of period $3 \cdot \Delta T$ at the time interval $\cdot \Delta T$, and three multiplying-type DA converters multiply these three unit pulse response signals $\phi_0(t+\Delta T)$, $\phi_0(t)$, $\phi_0(t-\Delta T)$ by the digital data $V_{-1}$, $V_0$, $V_{+1}$, respectively, at a speed of $a \cdot f_s$ (a times in time $\Delta T$). The outputs of these multiplying-type DA converters are combined into an analog signal $S_A$, which is delivered as an output.

8 Claims, 15 Drawing Sheets

FIG. 4
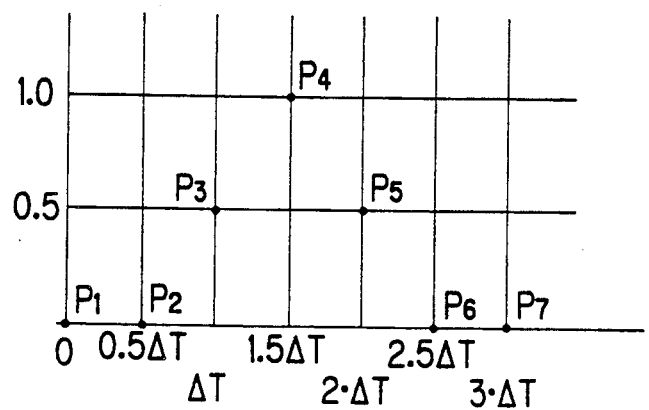
FIG. 5(a)
FIG. 5(b)
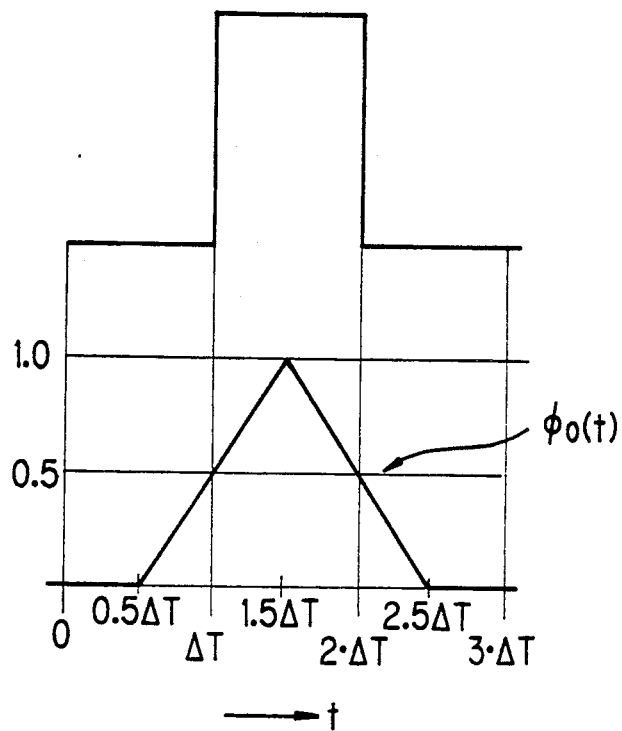

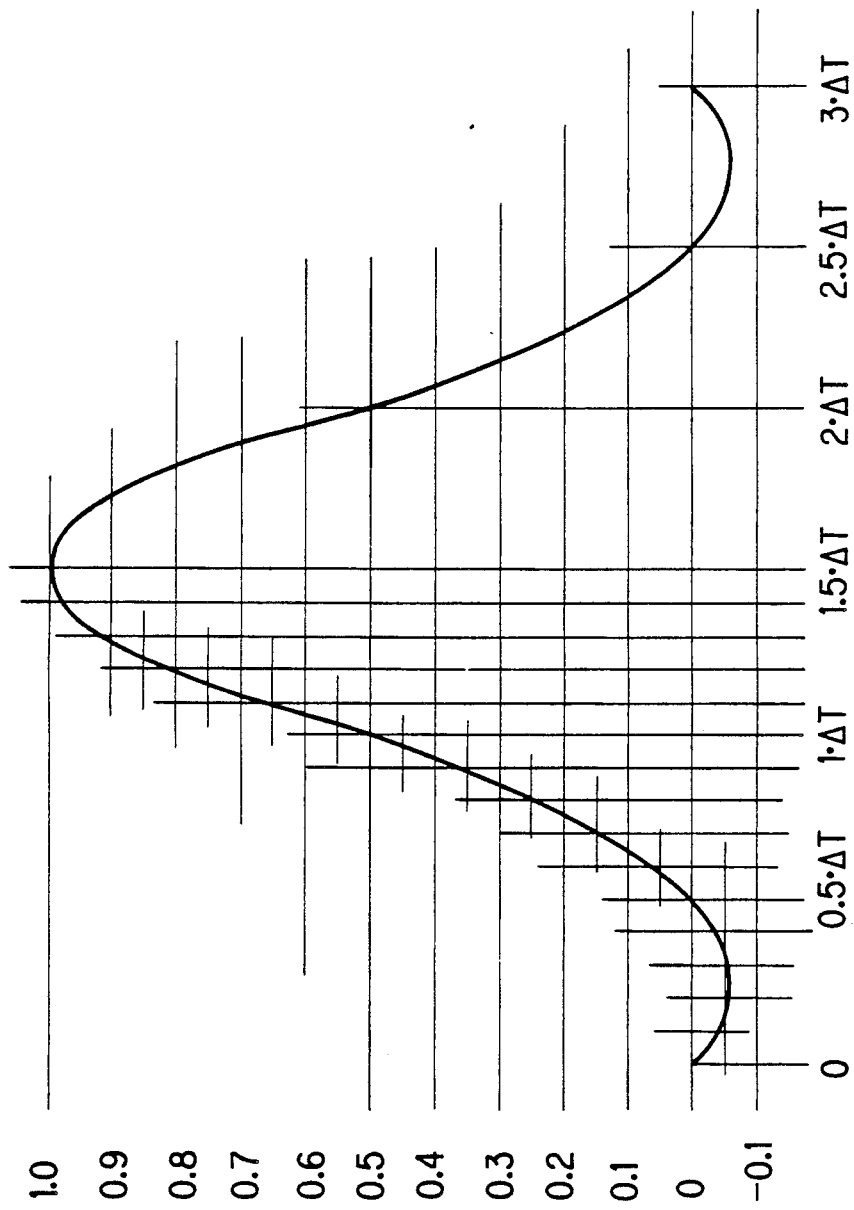

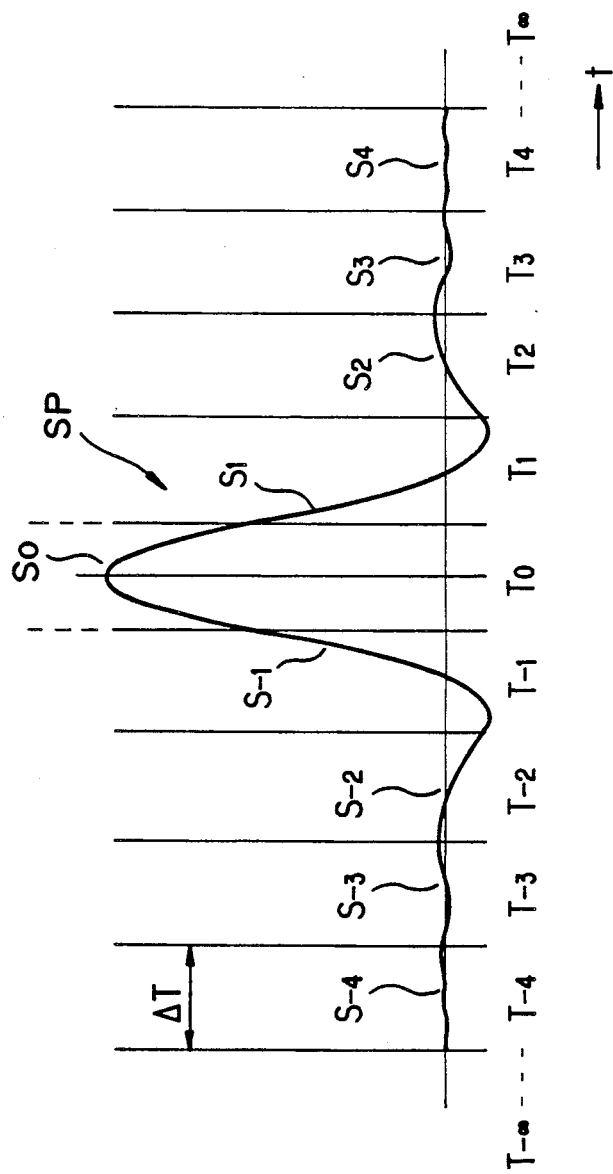

DIGITAL-ANALOG CONVERTER FOR CONVERTING DIGITAL AUDIO SIGNALS

BACKGROUND OF THE INVENTION

This invention relates to a digital-analog converter, and more particularly, to a digital-analog converter suitable for use in converting a digital audio signal into an analog audio signal.

In compact disc players (CD players) or digital tape recording/playback devices (DAT devices), it is required that musical signals expressed in digital form be converted into analog signals prior to output.

As shown in FIG. 12, a commonly employed digital-analog converter (hereinafter referred to as a "DA converter") for playing back music includes a digital current converter 1 for converting digital data DT, which is inputted at a certain sampling period, into a direct current $I_o$, a current-voltage converter 2 for converting the current $I_o$ into a voltage $S_D$ (see FIG. 13), and for holding the voltage, each time a sampling pulse $P_s$ is generated, and a low-pass filter 3 for forming the output voltage $S_D$ into a continuous, smooth analog signal $S_A$, which is the output of the filter 3. The current-voltage converter 2 includes a switch $S_W$ having a movable contact changed over by the sampling pulse $P_s$. When the movable contact is switched to a contact a, as shown in FIG. 12, an integrator is formed to generate the voltage $S_D$, which conforms to the current $I_o$. When the movable contact is switched to a contact b, a holding circuit is formed to hold the voltage $S_D$.

The foremost problems encountered in the DA converter for music playback are the precision with which the digital data is converted into a current value, the speed at which the conversion is made and phase distortion caused by the low-pass filter.

The problems of conversion precision and conversion speed have largely been solved by higher speed LSI's and advances in trimming techniques. Though phase distortion ascribable to the low-pass filter can be mitigated by employing a digital filter, phase distortion cannot be eliminated completely so long as the filter is an integral part of the structure.

FIGS. 14(a) and 14(b) is useful in describing phase distortion. FIG. 14(a) illustrates an original audio signal waveform 5a, a 1 KHz component waveform 5b, and an 8 KHz component waveform 5c. FIG. 14(b) illustrates an audio signal waveform 6a outputted by the low-pass filter 3 (FIG. 12), a 1 KHz component waveform 6b, and an 8 KHz component waveform 6c. It will be understood from these waveforms that, due to the delay in the phase of the 8 KHz component, the output audio signal 6a is different from the original audio signal 5a, and that this phase distortion becomes particularly pronounced at high frequencies. Thus, the presence of the low-pass filter results in a major deterioration in sound quality.

As shown in FIG. 15, the low-pass filter output when a pulsed signal is applied to the filter is sluggish at a leading edge 7a and oscillates at an envelope portion 7b and trailing edge 7c. Consequently, when a musical signal exhibiting a large impulse variation is applied to the low-pass filter, sound quality changes greatly and there are times when even the rhythmical sense of the musical signal differs.

To overcome these disadvantages, the inventors have proposed a digital-analog converter which, as shown in FIG. 16, includes a unit pulse response signal generator 1 for generating unit pulse response signals SP (see FIG. 17), a digital data generator 2 for generating 16-bit digital audio data at a predetermined time interval $_\Delta T$, a multiplier 3 for multiplying a unit pulse response signal generated at a certain time by a predetermined item of the digital audio data, and a mixer 4 for producing an analog signal output by combining the unit pulse response signals that have been multiplied by the digital audio data. By way of example, refer to the specification of U.S. Ser. No. 171,812 (entitled "Digital-Analog Converter", filed on Mar. 22, 1988).

In accordance with this proposed digital-analog converter, the unit pulse response generator 1 partitions a unit pulse response signal SP at a predetermined time interval $_\Delta T$ (see FIG. 17). When this is done, partial signals $S_{-K} \sim S_K$, which result from the partitioning operation, are repeatedly generated at the time interval $_\Delta T$, as shown in FIG. 18 (where only $S_{-1}$, $S_0$ and $S_1$ are illustrated). The digital data generator 2 stores (2k+1) items of the latest 16-bit digital audio data $V_{-K} \sim V_K$, which are generated at the predetermined time interval $_\Delta T$, in internal shift registers while sequentially shifting the same. Multiplying-type DA converters in the multiplier 3 respectively multiply the partial signals $S_K$ by predetermined 16-bit digital audio data $V_{-K}$ stored in the shift registers corresponding to the partial signals. The mixer 4 combines the signals outputted by the multiplying-type DA converters, thereby producing an analog signal output $S_A$ ($= \Sigma S_K \cdot V_{-K}$).

The inventors have proposed also a digital-analog converter in which the unit pulse response signal generator 1, rather than producing the partial signals $S_{-K} \sim S_K$, repeatedly outputs unit pulse response signals $SP_K$ (K = -4~4) per se at a period n·$_\Delta T$, as shown in FIG. 19 (where n=9), the multiplication operation $V_{-K} \cdot SP_{-K}$ is executed by the multiplying-type DA converter 3 every time slot, and the multiplier outputs are mixed by the mixer 4 to obtain an output signal analog signal $S_A$ ($= \Sigma V_K \cdot SP_K$). By way of example, refer to the specification of Japanese Patent Application No. 62-274803 (entitled "Digital-Analog Converter", filed on Oct. 30, 1987).

The partial signal waveforms $S_{-K} \sim S_K$ inputted to the multiplying-type DA converter in the proposed first digital-analog converter become discontinuous at the interval $_\Delta T$, as shown in FIG. 18(a)-18(c). Therefore, a problem that arises is that, owing to a limitation on the settling time of this multiplying-type DA converter, the analog signal $S_A$ outputted by the mixer 4 picks up spike-shaped noise every $_\Delta T$. Moreover, the waveform of the analog signal $S_A$ when a unit pulse UP is inputted to the proposed digital-analog converter is as shown in FIG. 20(b). Though the analog signal $S_A$ must take on the waveform shown in FIG. 17 in a case where the unit pulse UP is applied, the waveform that results is one in which the analog signal picks up spike noise (glitch noise) every $_\Delta T$ owing to the settling time of the multiplying-type DA converter.

With the second digital-analog converter, the unit pulse response signals $SP_K$ (K = -4~4) are repeatedly generated every 9·$_\Delta T$, so that only some discontinuity occurs every 9$_\Delta T$. Consequently, glitch noise generated in each time slot is small in comparison with that produced in the first digital-analog converter.

The first digital-analog converter takes into consideration the fact that the unit pulse response signal SP (FIG. 17) is sharply attentuated prior to a time slot $T_{-5}$ and after a time slot $T_5$, and approximates the unit pulse response signal SP by nine partial signals $S_{-4}$ through $S_4$ in nine time slots $S_{-4}$ through $S_4$, respectively. For this reason, the proposed digital-analog converter requires nine partial signal generators, a memory circuit composed of nine shift registers, and nine multiplying-type DA converters. This is disadvantageous in terms of an increase in size and cost.

Accordingly, if it is attempted to approximate the unit pulse response signal by a fewer number of partial signals in an effort to reduce the number of partial signal generators, the number of shift registers in the memory circuit and the number of multiplying-type DA converters, the occurrence of glitch noise will be accompanied by a new problem, in which the frequency characteristic of the analog signal output undergoes a fluctuation in level in the audible band.

Similarly, with the second digital converter, nine unit pulse response signal generators, nine latch circuits and nine analog multipliers are required. This results in a large and costly arrangement.

SUMMARY OF THE INVENTION

An object of the present invention is to provide a digital-analog converter through which it is possible to reduce the number of circuit units, such as the multiplying-type DA converters.

Another object of the present invention is to provide a digital-analog converter capable of reducing glitch noise.

A further object of the present invention is to provide a digital-analog converter capable of giving a flat frequency characteristic, namely one in which there is no level fluctuation in the audible band.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a view for describing the requirements of a unit pulse response signal necessary for constructing the digital-analog converter relating to the invention;

FIGS. 5(a) and 5(b) are graphs depicting a unit pulse and a response signal waveform in the present invention;

FIGS. 6 and 7 are waveform diagrams of other unit pulse response signal waveforms according to the invention;

FIGS. 8, 9 and 10 are views for describing the operation of the digital-analog converter of the present invention, in which FIG. 8 is a waveform diagram of three unit pulse response signals outputted by a function generator, FIG. 9 a view for describing a series of digital data and FIG. 10 a waveform diagram of a demodulated analog signal;

FIGS. 16, 17, 18a, 18b, and 18(c) are views for describing the general features of a proposed digital-analog converter, in which FIG. 16 is a block diagram, FIG. 17 a waveform diagram of a unit pulse response signal, and FIGS. 18(a)–18(c) are waveform diagrams of partial signals for producing a unit pulse response signal;

DESCRIPTION OF THE PREFERRED EMBODIMENT

Figure 1:
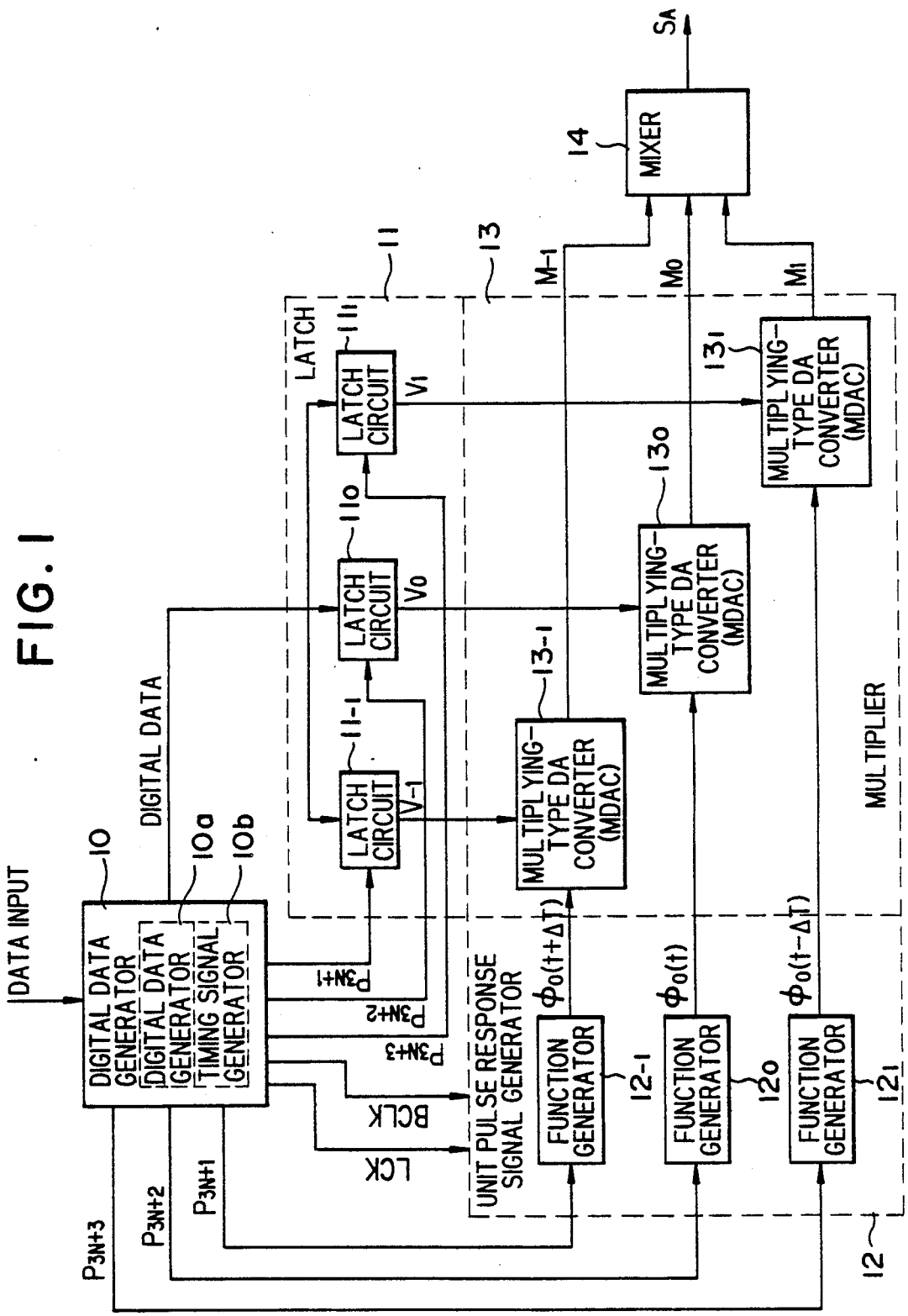
FIG. 1 is a block diagram of a digital-analog converter relating to the present invention.

A unit pulse response signal in accordance with the invention will be described in accordance with FIGS. 2 through 7, after which a digital-analog converter according to the invention will be described in accordance with FIG. 1.

Figure 2:
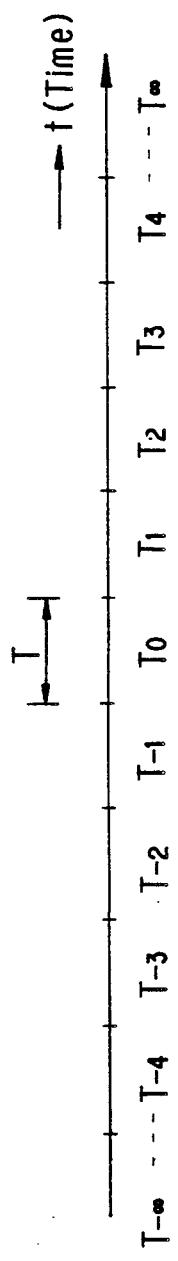
FIG. 2 is a view for describing time slots in a case where a time axis is divided at intervals of $\Delta T$.
Figure 3:
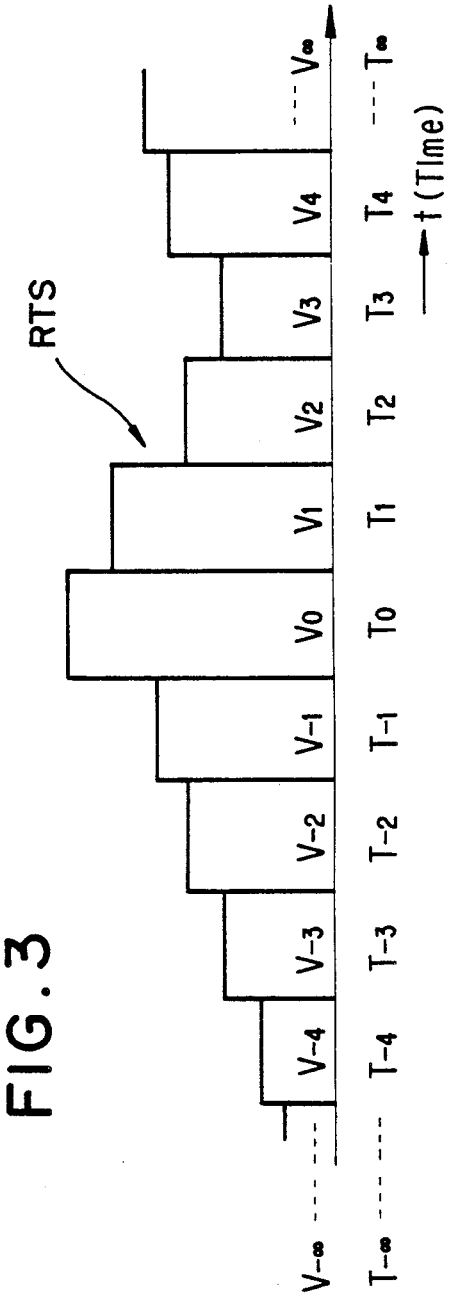
FIG. 3 is a view for describing digital data in each time slot.

If a time axis is divided at a predetermined time interval $\Delta T$, as shown in FIG. 2, and a discrete time signal value (digital value) in each time slot $T_K$ ($K = T_{-4}, T_{-3}, T_{-2}, T_{-1}, T_0, T_1, T_2, T_3, T_4, \ldots$) is designated by $V_K$, as shown in FIG. 3, then a continuous signal conforming to the discrete time signals RTS is obtained by superposting, along the time axis, pulse response signals weighted by the digital data $V_K$ inputted from one moment to the next.

In one embodiment, a condition is set (condition A) which requires that the unit pulse response signal pass through the points $P_i (i = 1 \sim 7)$ shown in FIG. 4). More specifically, the unit pulse response signal is a signal which has a period $3 \cdot \Delta T$ and assumes the following values:

0 at time $t = 0$ 0 at time $t = 0.5 \cdot \Delta T$ 0.5 at time $t = 1 \cdot \Delta T$ 1 at time $1.5 \cdot \Delta T$ 0.5 at time $t = 2 \cdot \Delta T$ 0 at time $t = 2.5 \cdot \Delta T$ 0 at time $t = 3 \cdot \Delta T$ FIGS. 5(a) and 5(b) are graphs depicting a unit pulse response signal which satisfies the abovementioned condition A, in which (a) is a unit pulse signal and (b) a unit pulse response signal $\phi_0(t)$.

The unit pulse response signal $\phi_0(t)$ is expressed by the following equation:

$$\phi_0(t) = \begin{cases} 0 & 0 \leq t < 0.5\Delta T \\ t - 0.5 & 0.5\Delta T \leq t < 1.5\Delta T \\ -t + 2.5 & 1.5\Delta T \leq t < 2.5\Delta T \\ 0 & 2.5\Delta T \leq t < 3\Delta T \end{cases} \tag{1}$$

Eq. (1) above is for a case where a unit pulse response signal is generated that will satisfy condition A by a straight line only. However, as shown in FIG. 6, condition A can also be satisfied solely by a quadratic function. In this case, the unit pulse response signal $\phi_0(t)$ will be expressed by the following equation:

$$\phi_0(t) = \begin{cases} -0.5t + t^2 & 0 \leq t < 0.5\Delta T \\ 0.5 + 2(t-1) - 2(t-1)^2 & \Delta T \leq t \leq 2\Delta T \\ 0.5 - 1.5(t-2) + (t-2)^2 & 2\Delta T \leq t < 3\Delta T \end{cases} \quad (2)$$

Figure 7:
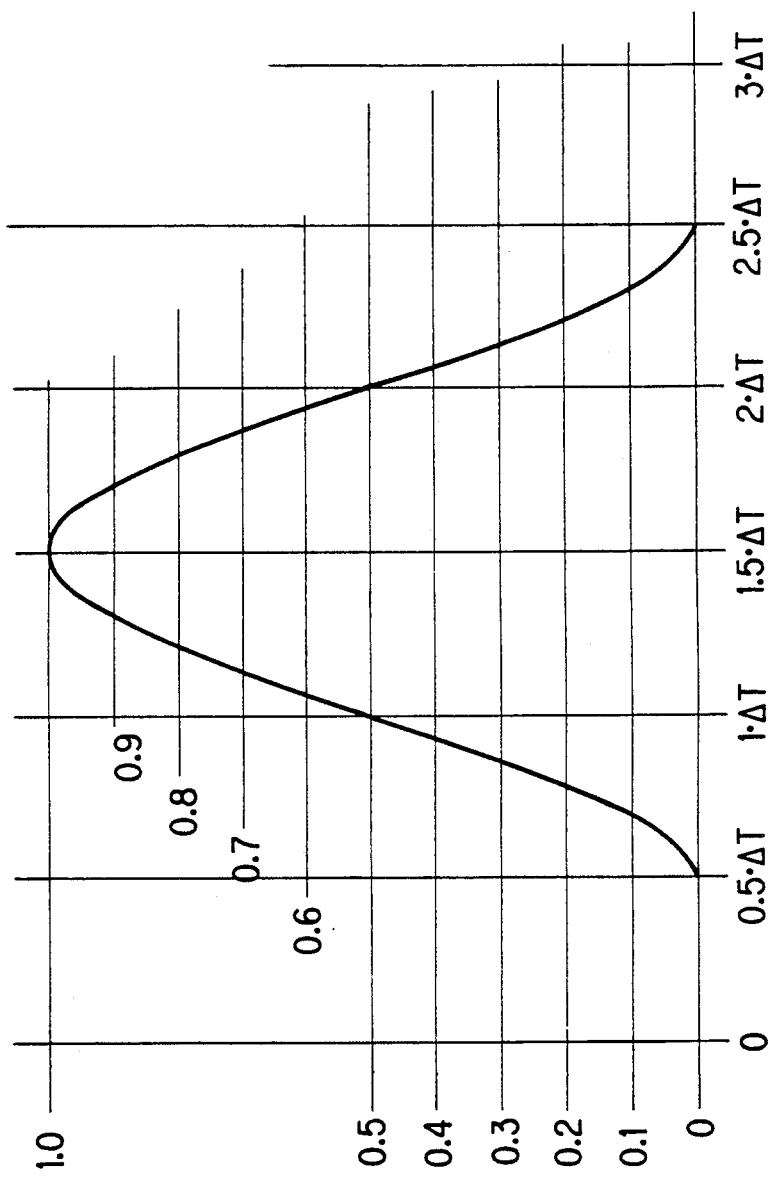

It can also be arranged so that condition A is satisfied using a straight line and a cubic function, as shown in FIG. 7, in which case the unit pulse response signal $\phi_0(t)$ will be expressed by the following equation:

$$\phi_0(t) = \begin{cases} 0 & 0 \leq t < 0.5\Delta T \\ -2(t-0.5)^3 + 3(t-0.5)^2 & 0.5\Delta T \leq t < 1.5\Delta T \\ 2(t-1.5)^3 + 3(t-1.5)^2 + 1 & 1.5\Delta T \leq t < 2.5\Delta T \\ 0 & 2.5\Delta T \leq t < 3\Delta T \end{cases} \quad (3)$$

Further, it can also be arranged so that condition A is satisfied solely by a cubic function or using a straight line and a sinusoidal function, or using a straight line or tangential function. The unit pulse response signal $\phi_0(t)$ will be expressed by Eqs. (4), (5) and (6) in respective ones of these cases. More specifically, the unit pulse response signal expressed solely by a cubic function will be as follows:

$$\phi_0(t) = \begin{cases} -2t^3/3 + 2t^2 - 2.5t/3 & 0 \leq t < 1.5\Delta T \\ 2(t-1.5)^3/3 - (t-1.5)^2 \\ \qquad -2(t-1.5)/3 + 1 & 1.5\Delta T \leq t < 3\Delta T \end{cases} \quad (4)$$

that expressed using a sinusoidal function will be as follows:

$$\phi_0(t) = \begin{cases} 0 & 0 \leq t < 0.5\Delta T \\ 0.5 \times \sin\{\pi(t-1)\} + 0.5 & 0.5\Delta T < t < 1.5\Delta T \\ 0.5 \times \cos\{\pi(t-1.5)\} + 0.5 & 1.5\Delta T < t < 2.5\Delta T \\ 0 & 2.5\Delta T < t < 3\Delta T \end{cases} \quad (5)$$

and that expressed using a tangential function will be as follows:

$$\phi_0(t) = \begin{cases} 0 & 0 \leq t < 0.5\Delta T \\ 0.2071 \times \tan[3\pi(t-0.5)/4] & 0.5\Delta T \leq t < 1.0\Delta T \\ 0.2071 \times \tan[3\pi(t-1.5)/4] + 1 & 1.0\Delta T \leq t < 1.5\Delta T \\ -0.2071 \times \tan[3\pi(t-1.5)/4] + 1 & 1.5\Delta T \leq t < 2.0\Delta T \\ 0.2071 \times \tan[3\pi(2.5-t)/4] + 1 & 2.0\Delta T \leq t < 2.5\Delta T \\ 0 & 2.5\Delta T \leq t < 3.0\Delta T \end{cases} \quad (6)$$

The digital-analog converter of the invention will now be described in accordance with FIG. 1. As shown in FIG. 1, the digital-analog converter includes a data generator 10 having a digital data generating section a and a timing generator 10b, a latch 11, a unit response signal generator 12 having function generators $12_{-1}$, $12_0$, $12_1$ for generating functions $\phi_0(t+T)$, $\phi_0(t)$, $\phi_0(t-T)$, respectively, a multiplier 13 having three multiplying-type DA converters $13_{-1} \sim 13_1$ connected to the latch 13 and unit pulse response signal generator 12, and a mixer 14 for combining a plurality of signals $M_{-1}$, $M_0$, $M_1$, which are outputted by the multiplier 13, to produce an analog signal output $S_A$.

The data generator 10 generates a bit clock BCLK, data latching pulses $P_{3N+1} \sim P_{3N+3}$ and a ROM data latching pulse LCK. The digital data generator 10a generates the digital data $V_K$ (see FIG. 3) of, e.g., 16 bits, at the predetermined time (sampling time) interval $\Delta T$ and stores the three latest items of digital data $V_{-1}$, $V_0$, $V_1$ successively in latch circuits $11_{-1}$, $11_0$, $11_1$ of latch 11 every $3 \cdot \Delta T$ with regard to each item of data. The frequency of the bit clock BCLK is a $f_s$ ($a = 64$, by way of example) where the sampling frequency is $f_s$ ($= 1/\Delta T$). The period of data latching pulses $P_{3N+1} \sim P_{3N+3}$ is $3 \cdot \Delta T$, with these latching pulses being successively displaced in phase by $\Delta T$.

The latch 11 has the three latch circuits $11_{-1}$, $11_0$, $11_1$. The digital data $V_K$ generated by the digital data generator 10a every $\Delta T$ are successively stored in cyclic fashion in response to the latch data pulses $P_{3N+1} \sim P_{3N+3}$. More specifically, the digital data generated by the digital data generator 10a every $\Delta T$ is first stored in the latch circuit $11_{-1}$, then the next item of digital data is stored in the latch circuit $11_0$, and finally the next item of digital data is stored in the latch circuit $11_1$. Then, starting from the fourth item of data, the digital data are stored cyclically in the latch circuits $11_{-1}$, $11_0$, $11_1$ again. From this point onward the same storage cycle is performed every three items of data.

Figure 8:
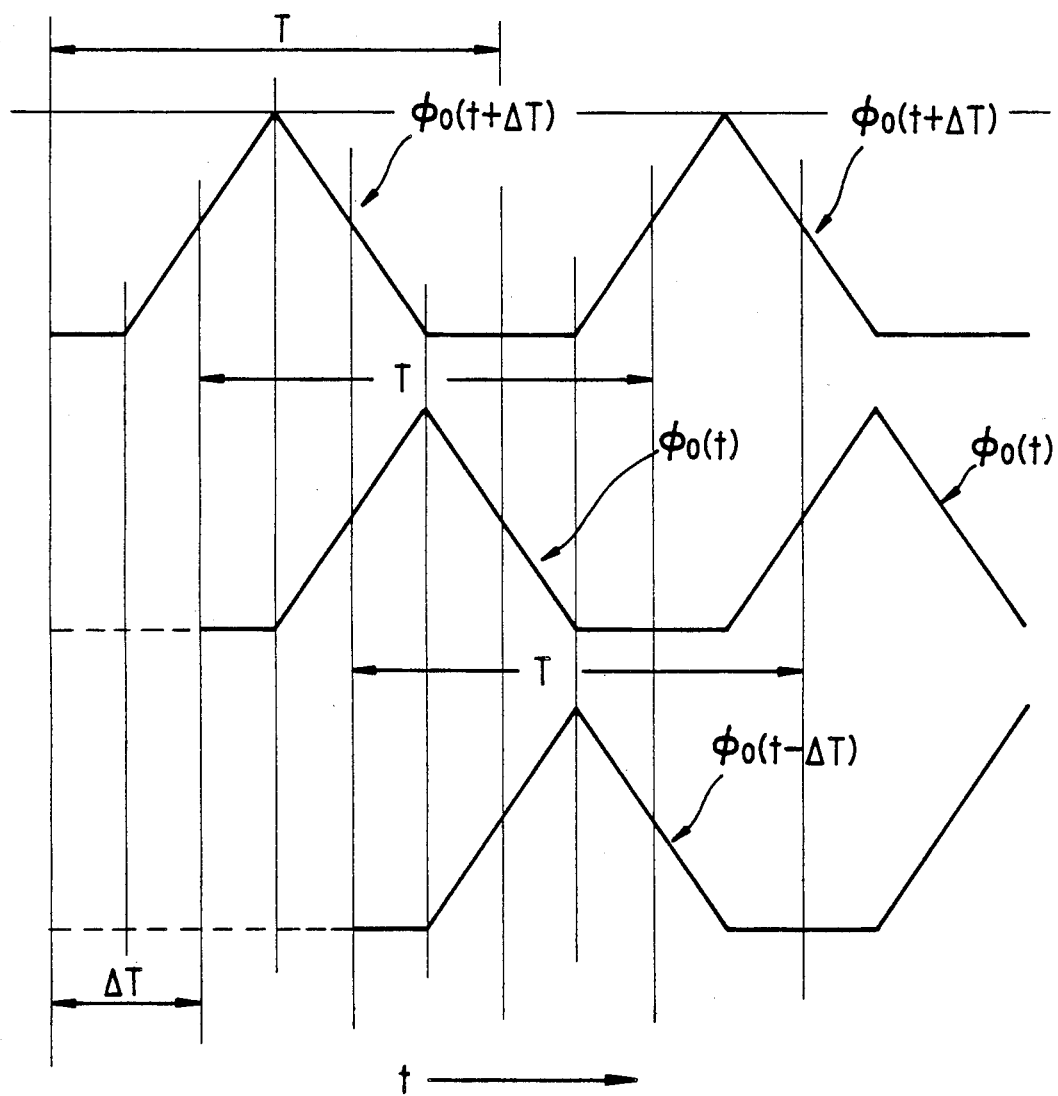

The unit pulse response signal generator 12 repeatedly generates three unit pulse response signals [for example, see FIG. 5(b)] having the time slot width ($= 3 \cdot \Delta T$) while applying time delay equivalent to the sampling time $\Delta T$. That is, the unit pulse response signal generator 12 has the three function generators $12_{-1}$, $12_0$, $12_1$. As shown in FIG. 8, the function generators repeatedly generate the respective unit pulse response signals $\phi_0(t+\Delta T)$, $\phi_0(t)$, $\phi_0(t-\Delta T)$ of period $T (= 3 \cdot \Delta T)$ successively delayed by $\Delta T$, as shown in FIG. 8.

Figure 11:
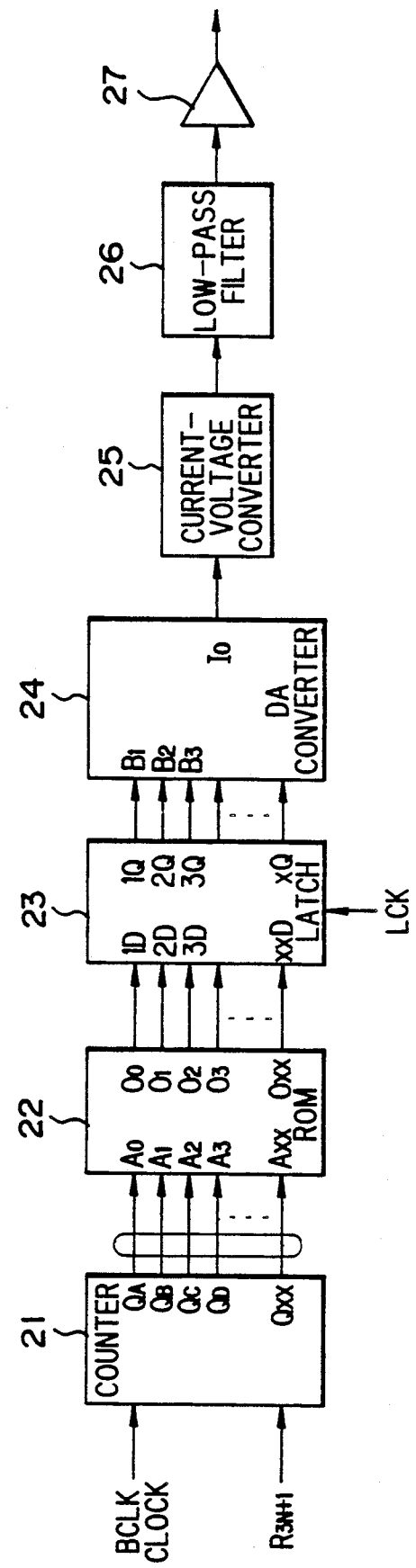
FIG. 11 is a block diagram of a function generator.
Figure 12:
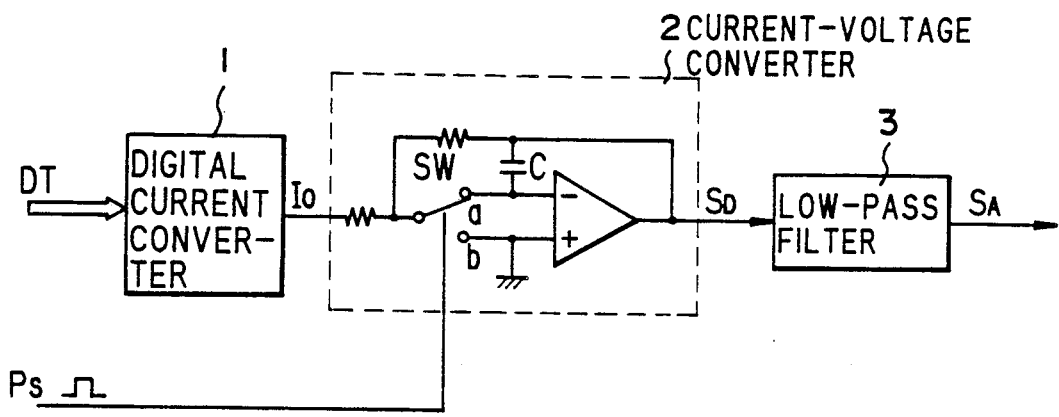
FIG. 12 is a block diagram of a digital-analog converter according to the prior art.
Figure 13:
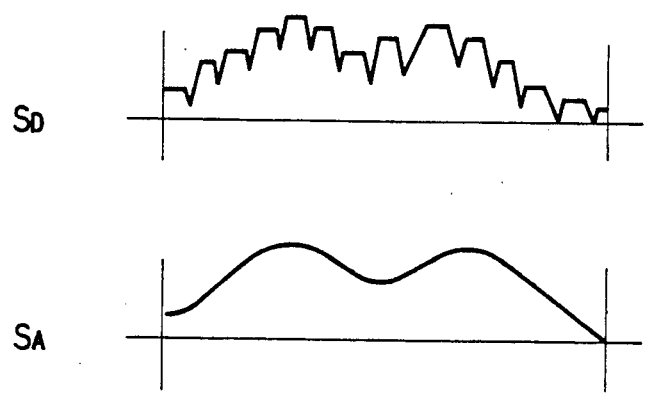
FIG. 13 is a waveform diagram of waveforms associated with the converter of FIG. 12.
Figure 14A:
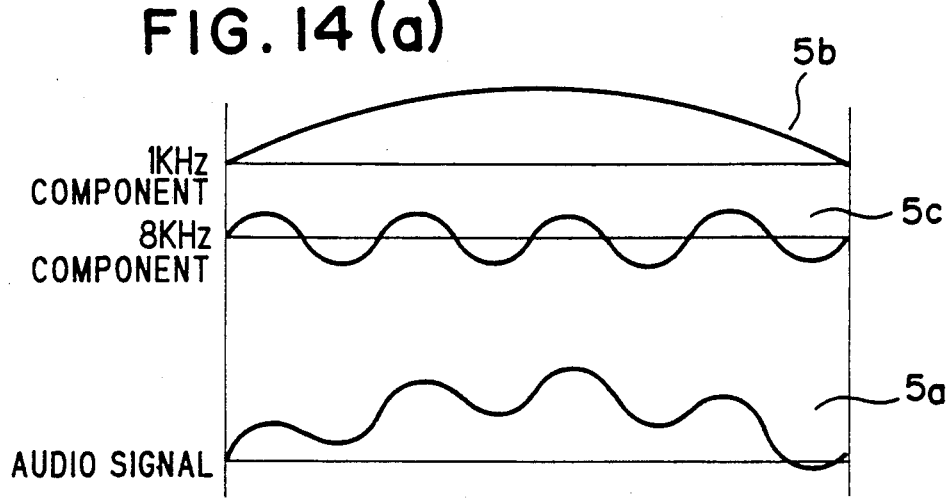
FIGS. 14(a), 14(b) and 15 are graphs depicting phase distortion and waveform distortion in the digital-analog converter of the prior art.
Figure 14B:
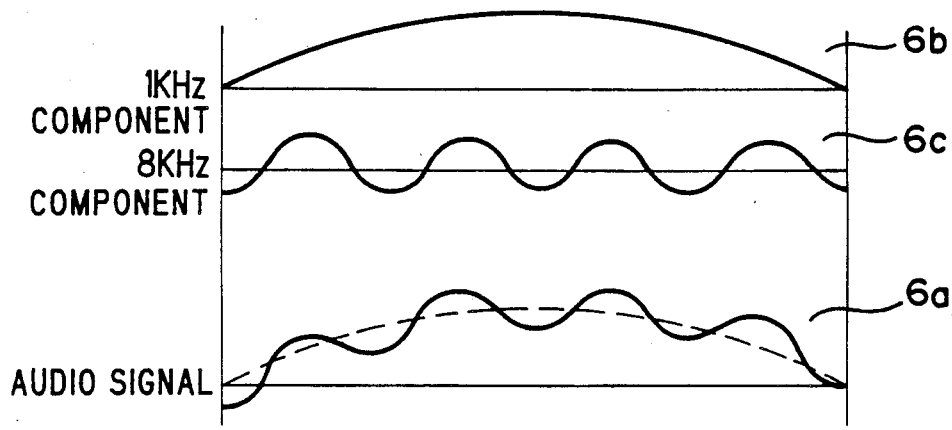
Figure 15:
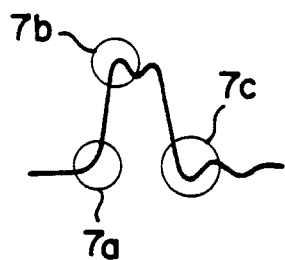
Figure 16:
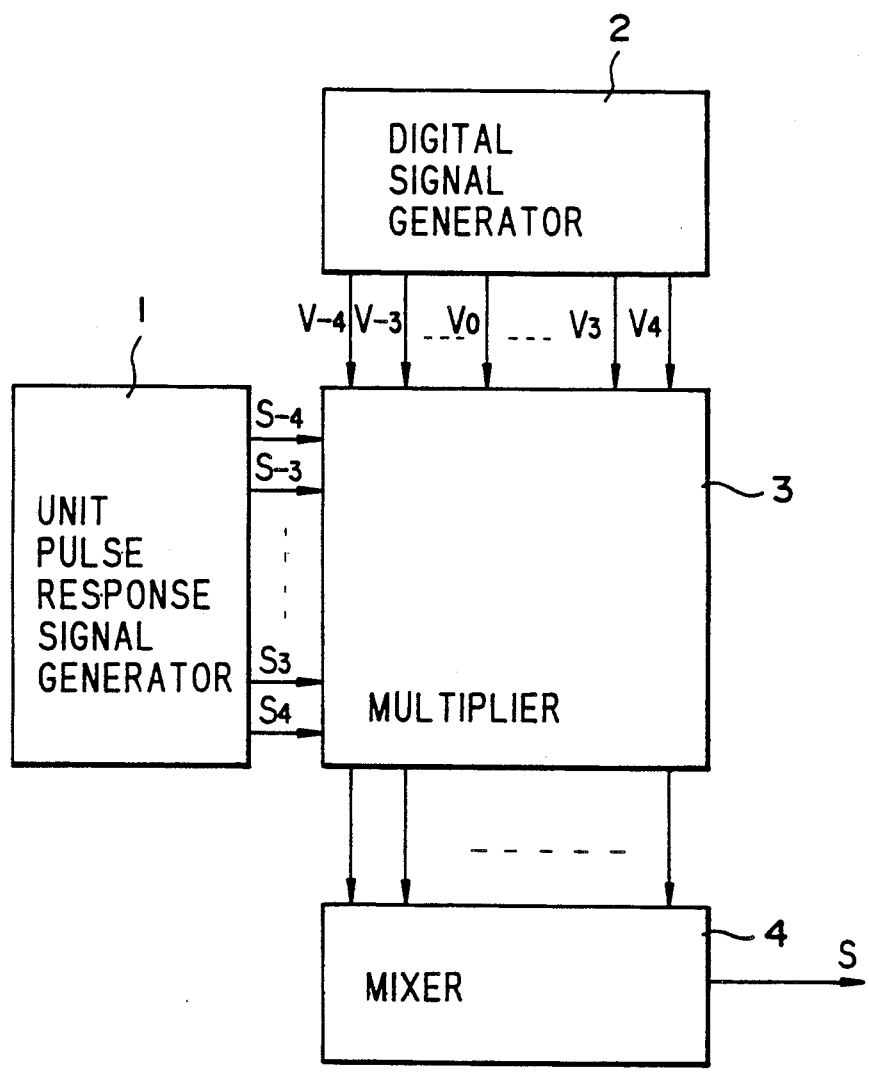
Figure 18A:
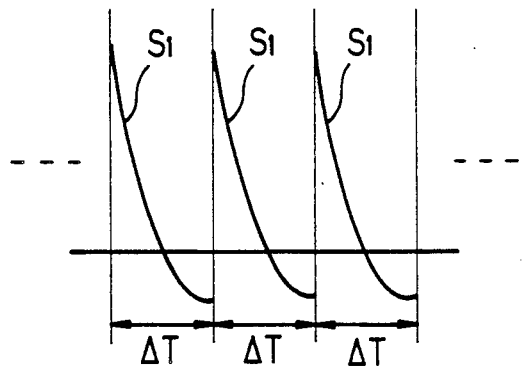
Figure 18B:
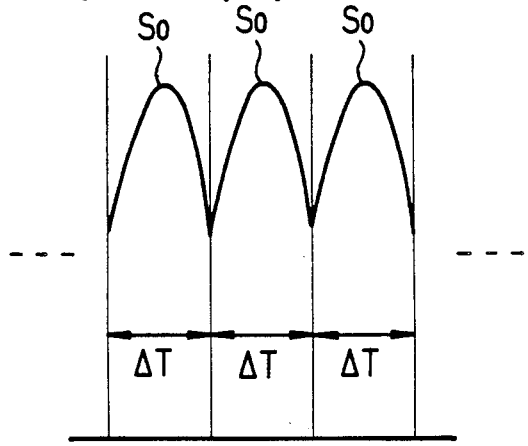
Figure 18C:
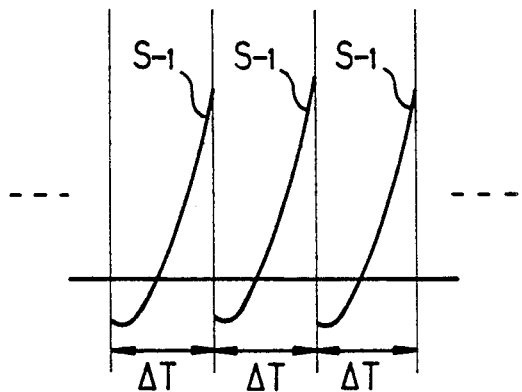
Figure 19:
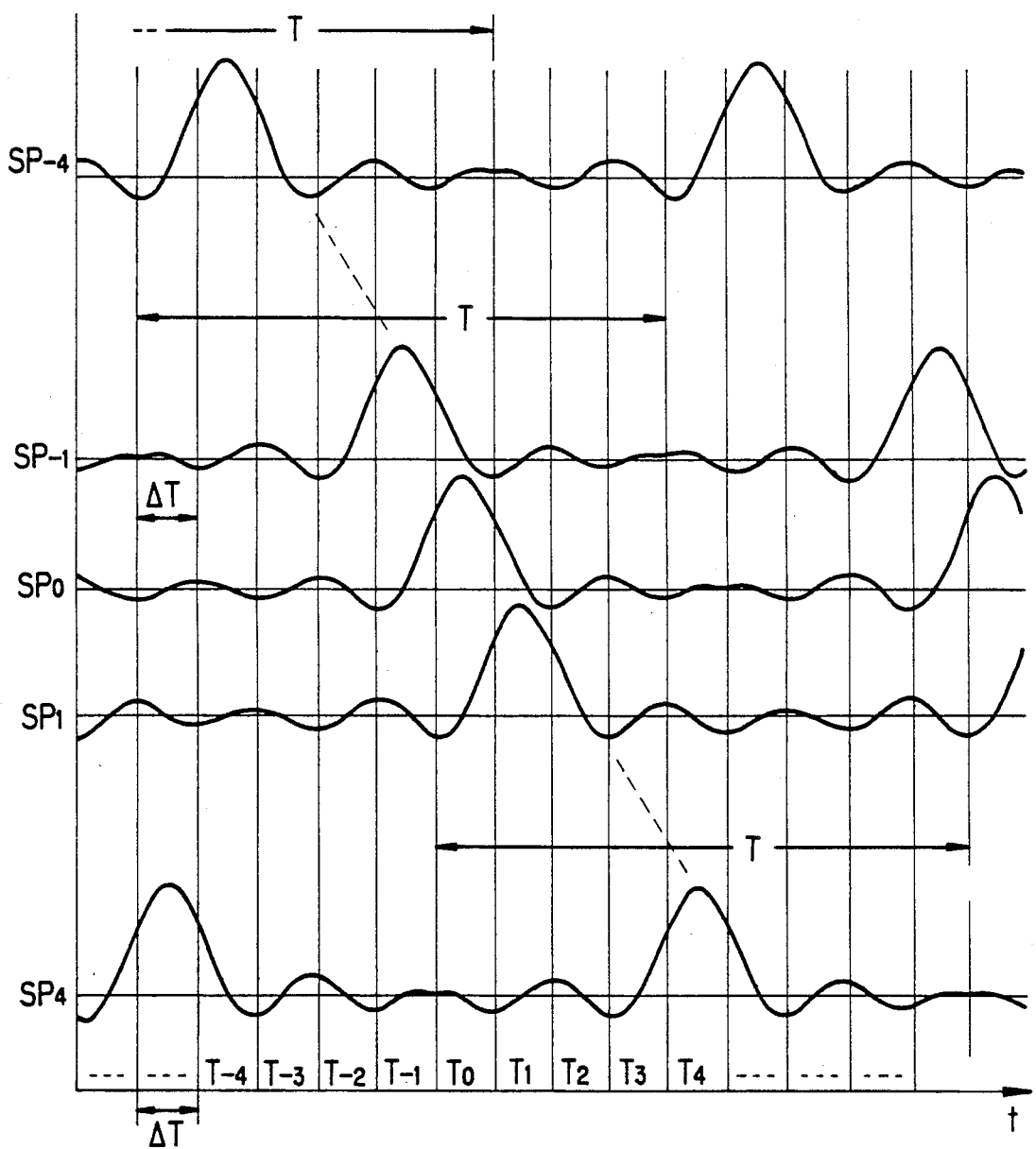
FIG. 19 is a waveform diagram of unit pulse response signals for describing the operation of another proposed digital-analog converter.
Figures 20A, 20B:
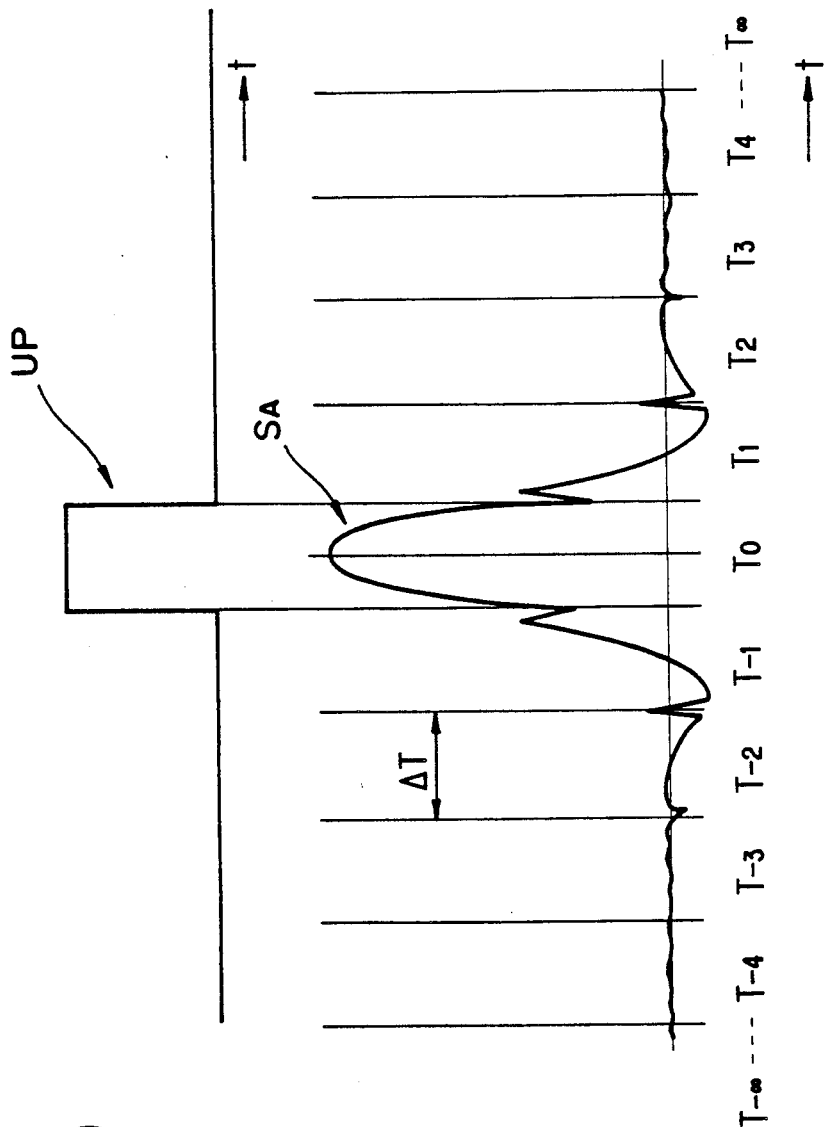
FIGS. 20(a) and 20(b) are a unit pulse and waveform diagram for describing the drawbacks of the proposed digital-analog converter.

FIG. 11 is a block diagram of the function generator $12_{-1}$. The function generator $12_{-1}$ includes: a counter 21, which has its count cleared by a reset pulse $R_{3N+1}$ (the same as the data latching pulse $P_{3N+1}$), and which counts the bit clock signal BCLK of frequency $a \cdot f_s$ (where $f_s$ is the sampling frequency) and generates an address signal $A_S$ of a ROM 22, which is the next stage; the ROM 22, which sequentially stores, in the order of its addresses, the digital values of function $\phi_0(t)$ digitized at the interval $1/(a \cdot f_s)$, and from which the digital data are successively read from storage areas designated by the address signals $A_S$ outputted by the counter 21, thereby generating the discrete function $\phi_0(t)$; a latch circuit 23 for latching the digital data outputted by the ROM; a DA converter 24 for converting the output of the latch circuit 23 into a current $I_0$ having a magnitude proportional to the digital value inputted thereto; a current-voltage converter (IV converter) 25 for converting the current value $I_0$ from the DA converter 24 into a voltage signal proportional to the current value $I_0$; a low-pass filter 26 for forming the output of the IV converter into a smooth, continuous analog signal; and an amplifier 27. The function generators $12_0$, $12_1$ have almost the same arrangement as the function generator shown in FIG. 11. The only difference is that the count in counter 21 is reset by the reset pulse $R_{3N+2}$ or $R_{3N+3}$ (the same as data latching pulse $P_{3N+2}$ or $P_{3N+3}$) instead of the reset pulse $R_{3N+1}$.

The multiplier 13 has the three multiplying-type DA converters (MDAC) $13_{-1} \sim 13_1$. The multiplying-type DA converter $13_{-1}$ multiplies the item of digital data $V_{-1}$ stored in the latch circuit $11_{-1}$ by the unit pulse response signal $\phi_0(t+\Delta T)$ and outputs the analog signal $M_{-1}$, the multiplying-type DA converter $13_0$ multiplies the item of digital data $V_0$ stored in the latch circuit $11_0$ by the unit pulse response signal $\phi_0(t)$ and outputs the analog signal $M_0$, and the multiplying-type DA converter $13_1$ multiplies the item of digital data $V_1$ stored in the latch circuit $11_1$ by the unit pulse response signal $\phi_0(t-\Delta T)$ and outputs the analog signal $M_1$.

The mixer 14 has the construction of a well-known analog adder for combining the analog signals $M_K (K=-1 \sim 1)$ outputted by the multiplying-type DA converters $13_{-1} \sim 13_1$, thereby producing the output analog signal SA.

Figure 9:
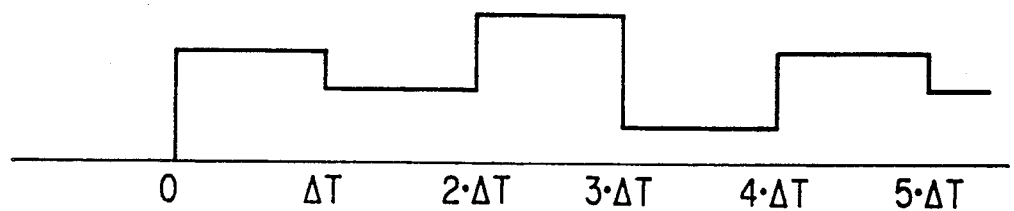
Figure 10:
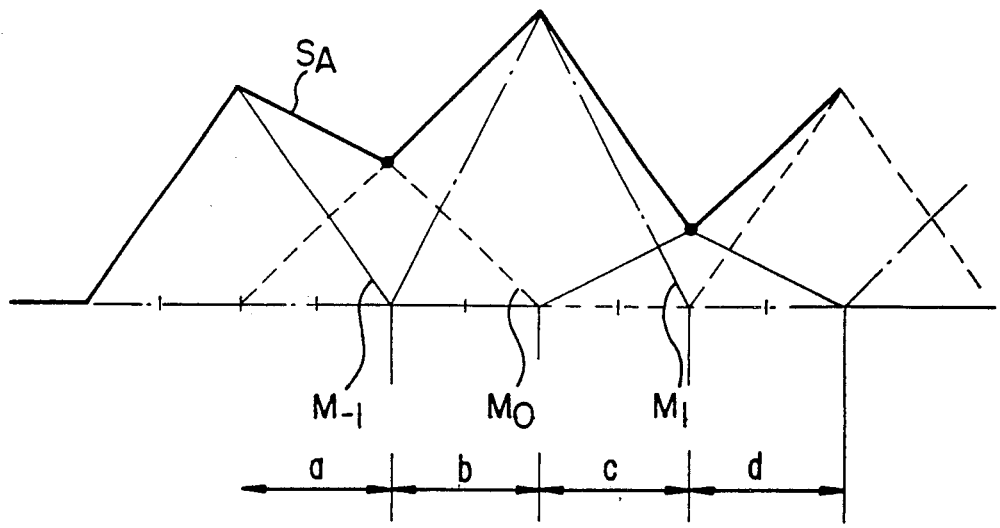

FIGS. 9 and 10 are views for a case where the waveform shown in FIG. 5(b), namely the waveform expressed by Eq. (1), is used as the unit pulse response signal. FIG. 9 illustrates a series of digital data, and FIG. 10 depicts a demodulated analog signal waveform $S_A$ (indicated by the bold lines). The fine solid lines in FIG. 10 indicate $M_{-1}$, corresponding to $\phi_0(t+\Delta T)$, the dashed lines indicate $M_0$, corresponding to $\phi_0(t)$, and the one-dot chain lines indicate $M_1$, corresponding to $\phi_0(t-\Delta T)$.

When Eq. (1) is adopted as the unit pulse response signal, the differential waveform of the demodulated signal becomes discontinuous. However, this is smoother than a PAM waveform (pulse amplitude modulation waveform).

If Eq. (2) is adopted as the unit pulse response signal and $D_{N-1}$, $D_N$, $D_{N+1}$ represent the values of three consecutive items of the latest data in a predetermined time slot, then a demodulated analog signal waveform $L_N(t)$ in the abovementioned time slot will be expressed by the following equation:

$$L_N(t) = D_{N+1}(-0.5t + t^2) + D_N(-3.5 + 6t - 2t^2) +$$

-continued
$$D_{N-1}(7.5 - 5.5t + t^2)$$

If $D_{N-1}=D_N=D_{N+1}=1$ holds, then $L_N(t)=1$ will hold. If a 1 KHz analog sinusoidal signal is sampled at a frequency of 44.1 KHz, the value of an N-th item of sampling data $D_N$ will be $$D_N = \sin(2\pi N/44.1) = \sin(\omega_0 N)$$

Accordingly, the analog signal $L_N(t)$ will be as follows:

$$L_N(t) = \{-3.5\sin\omega_0 N + 7.5\sin\omega_0(N-1)\} +$$
$$\{-5.5\sin\omega_0(N-1) + 6\sin\omega_0 N - 0.5\sin\omega_0(N+1)\}t +$$
$$\{\sin\omega_0(N-1) - 2\sin\omega_0 N + \sin\omega_0(N+1)\}t^2$$

When Eq. (2) is employed as a unit pulse response signal, the differential waveform of the unit pulse response signal will contain a point of discontinuity and, hence, so will the demodulated analog signal to some extent. However, the demodulated analog signal will pass through the sampled data values (sampling points) and will be smoother in comparison with the case in which Eq. (1) is used.

If Eq. (3) is adopted as the unit pulse response signal and $D_{N-1}$, $D_N$, $D_{N+1}$ represent the values of three consecutive items of the latest data in a predetermined time slot, then a demodulated analog signal waveform $L_N(t)$ in the abovementioned time slot will be expressed by the following equation:

$$L_N(t) = D_{N-1}\{2(t-1.5)^3 - 3(t-1.5)^2 + 1\} +$$
$$D_N\{-2(t-0.5)^3 + 3(t-0.5)^2\}$$
$$0 \leq t < 0.5\Delta T$$

$$L_N(t) = D_N\{2(t-1.5)^3 - 3(t-1.5)^2 + 1\} +$$
$$D_{N+1}\{-2(t-0.5)^3 + 3(t-0.5)^2\}$$
$$0.5\Delta T \leq t < 1.0\Delta T$$

When Eq. (3) is employed as a unit pulse response signal, the differential function of the unit pulse response signal will be continuous. As a consequence, the demodulated analog signal will be a smooth signal passing through the sampled data values (sampling points) and free of points of discontinuity.

If Eq. (4) is employed as a unit pulse response signal, the differential function of the unit pulse response signal will be discontinuous and, hence, so will the demodulated analog signal to some extent. However, the function will pass through the sampling points and will smoothly connect them.

If Eq. (3) is adopted as the unit pulse response signal and $D_{N-1}$, $D_N$, $D_{N+1}$ represent the values of three consecutive items of the latest data in a predetermined time slot, then a demodulated analog signal waveform $L_N(t)$ in the abovementioned time slot will be expressed by the following equation:

$$L_N(t) = D_{N-1}\{0.5\cos(t-1.5)\pi + 0.5\} +$$
$$D_N\{0.5\sin(t-1)\pi + 0.5\}$$
$$0 \leq t < 0.5\Delta T$$

$$L_N(t) = D_N\{0.5\cos(t - 1.5)\pi + 0.5\} +$$

$$D_{N+1}\{0.5\sin(t - 1)\pi + 0.5\}$$

$$0.5\Delta T \leq t < 1.0\Delta T$$

When Eq. (5) is employed as a unit pulse response signal, the differential function of the unit pulse response signal will be continuous. Accordingly, the demodulated analog signal will be a smooth signal passing through the sampling points and free of points of discontinuity. A sixth degree function of the following kind can also be considered as an identical function passing through all of the points shown in FIG. 4:

$$\phi_0(t) = -6.928 \cdot 10^3 t^6 + 1.35 t^5 + 6.62 t^4 + \quad (7)$$

$$10.44 t^3 - 5.02 t^2 + 0.0638 t + 0.2894$$

The foregoing relates to a case where the unit pulse response signal $\phi_0(t)$ is decided so as to pass through all of the points $P_i(i=1-7)$ in FIG. 4. However, it is permissible to decide the unit pulse response signal so as to pass through the points $P_1$, $P_2$, $P_4$, $P_6$ and $P_7$. If the unit pulse response signal adopted is connected in the form of a quadratic function with the value of the unit pulse response signal at $t=\Delta T$ and $2\Delta T$ being a $(0<a<1)$, then this signal will be expressed by the following equation:

$$\phi_0(t) = \quad (8)$$

$$\begin{bmatrix} -at + 2at^2 & 0 \leq t < \Delta T \\ a + 4(1-a)(t-1) - 4(1-a)(t-1)^2 & \\ & \Delta T \leq t < 2\Delta T \\ a - 3a(t-2) + 2a(t-2)^2 & \\ & 2\Delta T \leq t < 3\Delta T \end{bmatrix}$$

If a is changed in the unit pulse response signal of Eq. (7), there will be a change in the static characteristics, such as the f characteristic and distortion factor, and in the sound quality as well. Therefore, it is possible to determine a desirable value for a. It should be noted that this will coincide with Eq. (2) at $a=0.5$. Further, considering the continuity of the unit pulse response signal, we will have $a=4/7$.

As another embodiment, it is also permissible to decide a unit pulse response signal in which the condition is that the signal pass through the points $P_1$, $P_4$ and $P_7$ only. The following equations (9) through (14) serve as examples:

$$\phi_0(t) = \{0.54 + 0.46\cos[\pi(t/1.5-1)]\}^n \quad (9)$$

$$\phi_0(t) = \{0.5 + 0.5\cos[\pi(t/1.5-1)]\}^n \quad (10)$$

$$\phi_0(t) = \{0.42 + 0.5\cos[\pi(t/1.5-1)] + \quad (11)$$
$$0.08\cos[2\pi(t/1.5-1)]\}^n$$

$$\phi_0(t) = \{0.54 + 0.46\cos[\pi(t/1.5-1)]\}^n \times \quad (12)$$
$$\{0.5 + 0.5\cos[\pi(t/1.5-1)]\}^m$$

$$\phi_0(1t) = \{0.54 + 0.46\cos[\pi(t/1.5-1)]\} \times \quad (13)$$
$$\{0.42 + 0.5\cos[\pi(t/1.5-1) + 0.08\cos[2\pi(t/1.5-1)]\}^m$$

$$\phi_0(t) = \{0.5 + 0.5\cos[\pi(t/1.5-1)]\}^n \times \quad (14)$$
$$\{0.42 + 0.5\cos[\pi(t/1.5-1)] + 0.08\cos[2\pi(t/1.5-1)]\}^m$$

Here n and m are arbitrary. Sound quality can be finely adjusted by selecting these numbers. Inserting a corrective term C into the foregoing equations will make it possible to change the shape of the unit pulse response signal and finely adjust sound quality. Using Eq. (10) as one example, we have $$\phi_0(t) = \begin{bmatrix} 0 & 0 \leq t < C \\ 0.5 + 0.5\cos[\pi(2t/(3-2C) \\ -3/(3-2C)] & C \leq t < 3-C \\ 0 & 3-C \leq t < 3 \end{bmatrix} \quad (15)$$

As still another embodiment, an effective unit pulse response signal is one in which only $3 \cdot \Delta T$ at the center of the prior-art example (which ends at $9 \cdot \Delta T$) is multiplied by a window function. An example of this signal is as follows:

$$\phi_0(t) = \begin{bmatrix} \{0.5 + 0.5\cos[\pi(t/1.5-1)]\} \cdot \\ (-19.081 - 0.084t + 0.971t^2) \\ 0 \leq t < 1 \\ \{0.5 + 0.5\cos[\pi(t/1.5-1)]\} \cdot \\ (-2.735 + 4.98t - 1.66t^2) \\ 1 \leq t < 2 \\ \{0.5 + 0.5\cos[\pi(t/1.5-1)]\} \cdot \\ (7.789 - 5.544t + 0.971t^2) \\ 2 \leq t < 3 \end{bmatrix} \quad (16)$$

Thus, in accordance with the invention, three unit pulse response signals of period $3\Delta T$ are generated consecutively with a phase difference of $\Delta T$ between them (where $\Delta T$ represents the digital data sampling time). Each pulse response signal has a value of 0 at time $t=0$, 0 at $t=0.5\Delta T$, 1 at $t=1.5\Delta T$, 0 at $t=2.5\Delta T$, and 0 at $t=3\Delta T$. Three items of the latest digital data are each stored in memory every $3 \cdot \Delta T$, each of the unit pulse response signals is multiplied by these digital data and the results are mixed and then subjected to a digital-to-analog conversion. This makes it possible to reduce the number of circuit units, such as the unit pulse response signal generating circuits and multiplying-type DA converters, so that the apparatus can be reduced in size and lowered in cost. In addition, glitch noise can be reduced and level fluctuations can be suppressed in the audible region.

Further, in accordance with the invention, it is possible to obtain a unit pulse response signal desirable in terms of the human sense of hearing. Moreover, since the digital data pass through the latch circuitry only once, there is no contamination (modulation) of the data. Since the adding system is small, there is little modulation due to system imbalance. The result is excellent sound quality.

Further, since the apparatus is simple in arrangement, points requiring adjustment are few and therefore it is easy to adjust sound quality.

As many apparently widely different embodiments of the present invention can be made without departing from the spirit and scope thereof, it is to be understood that the invention is not limited to the specific embodiments thereof except as defined in the appended claims.

What is claimed is:

1. A digital-analog converter, comprising:
   a unit pulse response signal generator for successively generating unit pulse response signals, including first, second and third function generators, each unit pulse response signal having a period of $3\cdot\Delta T$, successively delayed in phase by a predetermined time interval $\Delta T$, where $\Delta T$ represents sampling time of digital data;
   a data generator for outputting an item of the digital data at the predetermined time interval;
   three memories, operatively connected to said data generator, for successively storing three latest items of the digital data output by said data generator;
   three multiplying-type digital/analog converters, each operatively connected to one of said first, second and third function generators and one of said three memories, for multiplying the unit pulse response signals by the digital data stored in said three memories, respectively and for outputting results of the multiplication as outputs; and
   a mixer for combining the outputs from said three multiplying-type digital/analog converters into an analog signal which is delivered as an output.

2. The digital-analog converter according to claim 1, wherein said first function generator generates the unit pulse response signal to produce a value of 0 at time $t=0$, 1 at time $t=1.5\cdot\Delta T$, and 0 at time $t=3\cdot\Delta T$.

3. The digital-analog converter according to claim 1, wherein said first function generator generates the unit pulse response signal to produce a value of 0 at time $t=0$, 0 at time $t=0.5\cdot\Delta T$, 1 at time $t=1.5\cdot\Delta T$, 0 at time $t=2.5\cdot\Delta T$ and 0 at time $t=3\cdot\Delta T$.

4. The digital-analog converter according to claim 1, wherein said first function generator generates the unit pulse response signal to produce a value of 0 at time $t=0$, 0 at time $t=0.5\cdot\Delta T$, 0.5 at time $t=\Delta T$, 1 at time $t=1.5\cdot\Delta T$, 0.5 at time $t=2\cdot\Delta T$, 0 at time $t=2.5\cdot\Delta T$, and 0 at time $t=3.0\cdot\Delta T$.

5. The digital-analog converter according to claim 4, wherein the unit pulse response signal is expressible by linear equations.

6. The digital-analog converter according to claim 4, wherein the unit pulse response signal is expressible by quadratic equations.

7. The digital-analog converter according to claim 4, wherein the unit pulse response signal is expressible by cubic equations.

8. The digital-analog converter according to claim 4, wherein the unit pulse response signal is expressible by a combination of curves including at least two of straight lines, cubic curves, sinusoidal curves and tangential curves.

* * * * *